United States Patent [19]

Simko

[11] Patent Number: 4,533,846
[45] Date of Patent: Aug. 6, 1985

[54] INTEGRATED CIRCUIT HIGH VOLTAGE CLAMPING SYSTEMS

[75] Inventor: Richard T. Simko, Los Altos, Calif.

[73] Assignee: Xicor, Inc., Milpitas, Calif.

[21] Appl. No.: 382,713

[22] Filed: May 27, 1982

Related U.S. Application Data

[63] Continuation-in-part of Ser. No. 230,683, Feb. 2, 1981, and a continuation-in-part of Ser. No. 6,026, Jan. 24, 1979, Pat. No. 4,314,265, and a continuation-in-part of Ser. No. 6,030, Jan. 24, 1979, Pat. No. 4,274,012.

[51] Int. Cl.³ ............................................... H03K 5/08
[52] U.S. Cl. .................................... 307/550; 307/548; 307/555; 307/568; 307/573

[58] Field of Search ............... 307/540, 542, 546, 548, 307/549, 550, 555, 557, 568, 573, 575, 318

[56] References Cited

U.S. PATENT DOCUMENTS

| | | | |
|---|---|---|---|
| 3,482,134 | 12/1969 | Mann | 307/555 |
| 3,538,347 | 11/1970 | Spotts | 307/555 |
| 4,323,792 | 4/1982 | Bergmann et al. | 307/549 |

Primary Examiner—John Zazworsky
Attorney, Agent, or Firm—Fitch, Even, Tabin & Flannery

[57] ABSTRACT

Integrated high voltage clamping methods and devices which provide a controllable "soft" clamping action. The systems are particularly useful for "on-chip" EEPROM high voltage power supplies.

17 Claims, 9 Drawing Figures

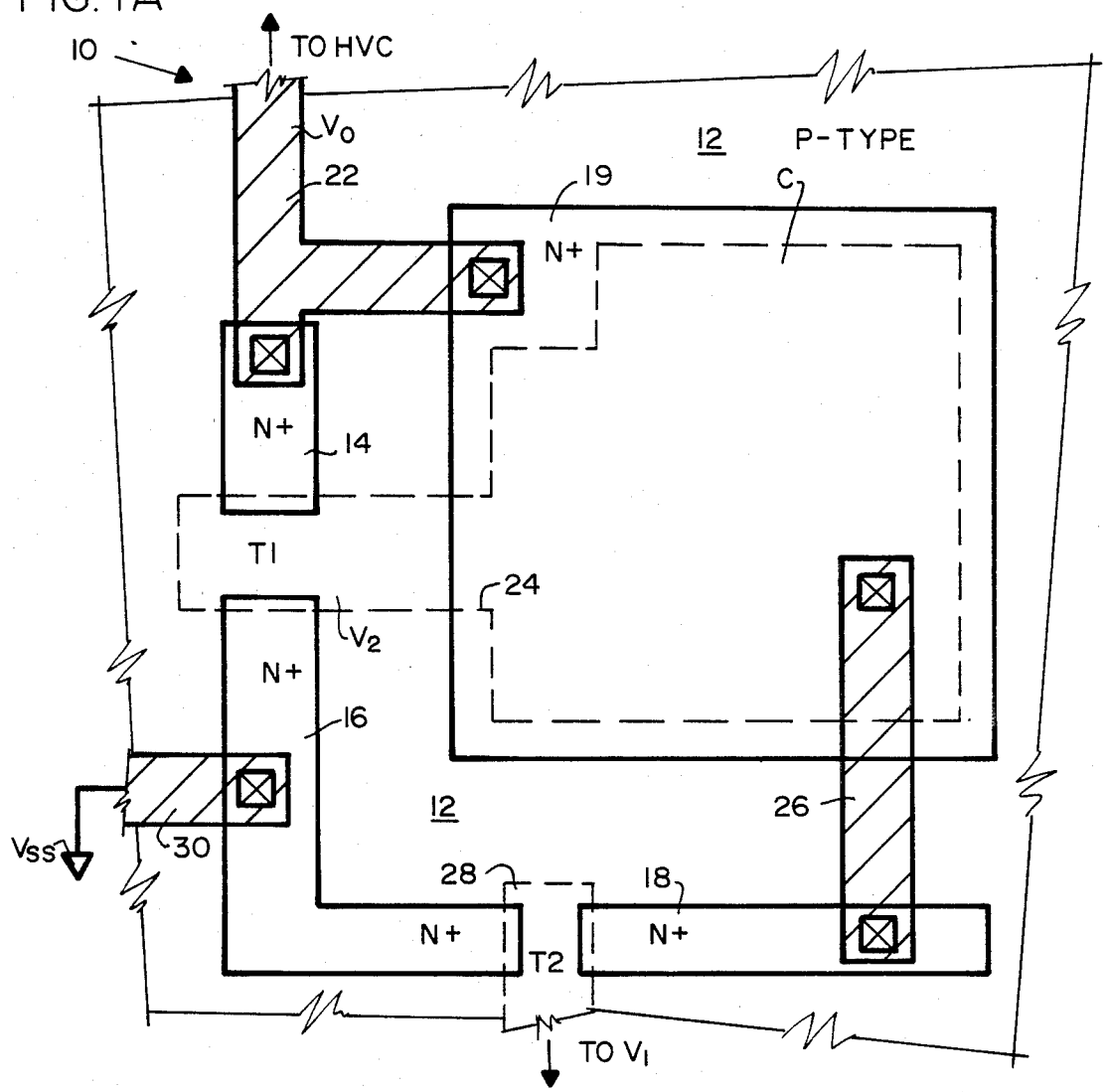
FIG. IA
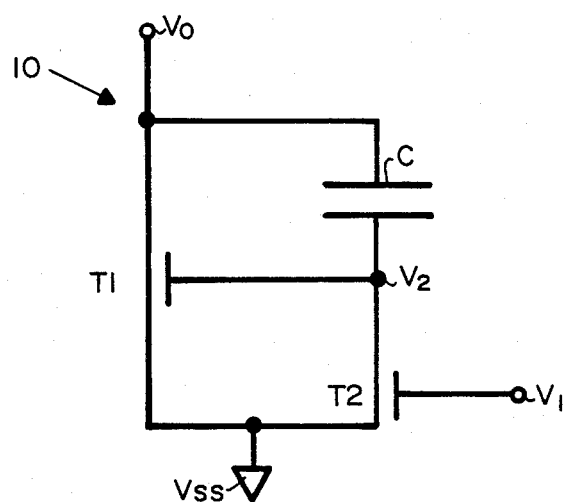
FIG. I

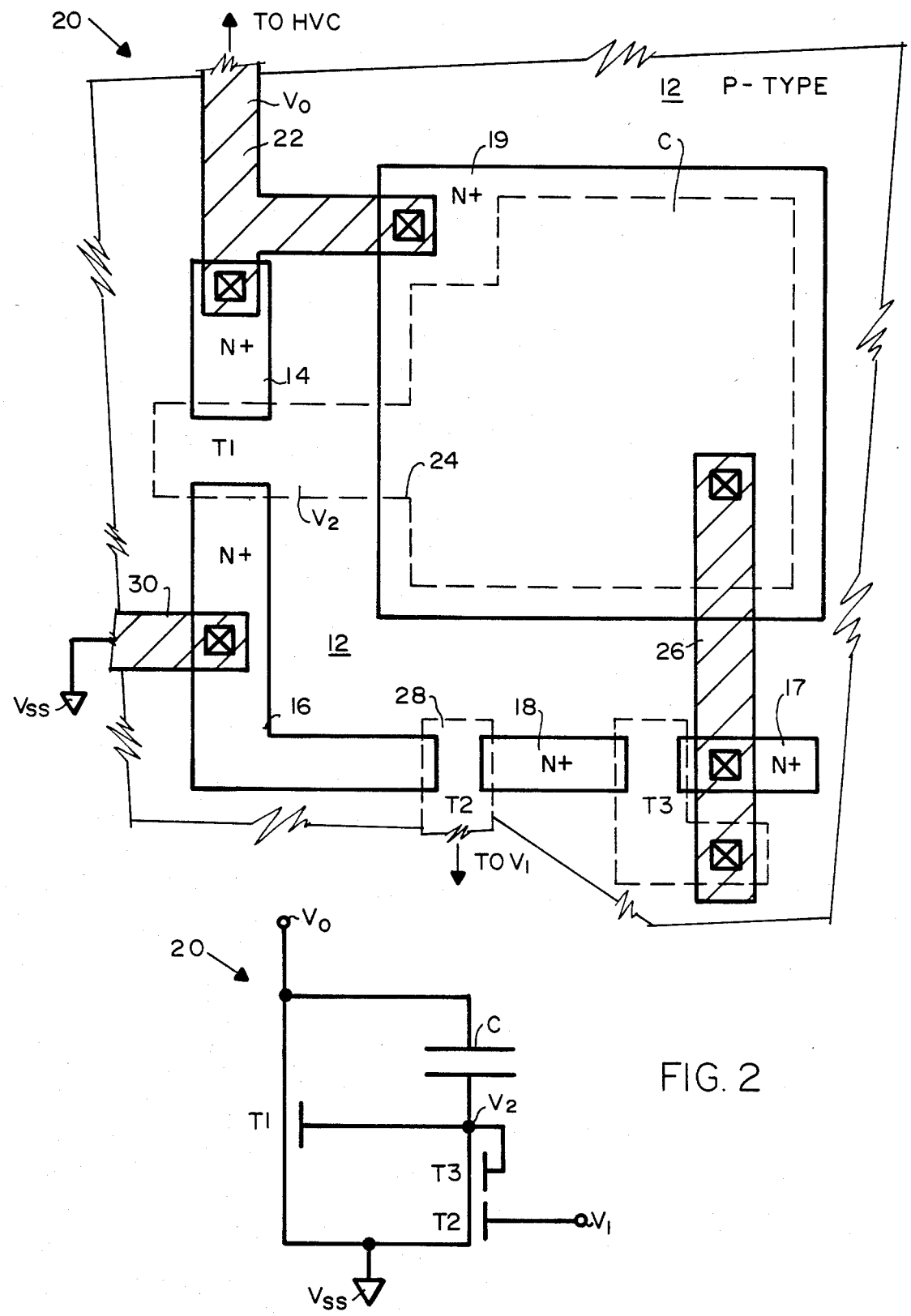

INTEGRATED CIRCUIT HIGH VOLTAGE CLAMPING SYSTEMS

This application is a continuation-in-part of application Ser. No. 230,683 filed Feb. 2, 1981, now U.S. Pat. No. 4,486,769, and applications Ser. Nos. 6,026 and 6,030 both filed Jan. 24, 1979, now U.S. Pat. Nos. 4,314,265 and 4,274,012, which are incorporated by reference herein.

The present invention relates generally to the field of integrated circuit high voltage control systems, and more particularly, relates to clamping methods and circuits for controlling the potential of high voltage power supplies such as integrated circuit high voltage generators. Methods and circuitry in accordance with the present invention find particular utility in connection with integrated circuits such as nonvolatile programmable random access memory devices (EEPROM's) which utilize "on-chip" generated high voltage power supplies.

In this regard, nonvolatile memory elements and arrays such as described in U.S. Pat. Nos. 4,274,012, 4,300,212 and 4,314,265 have been provided which utilize relatively high voltages for programming and erasing of nonvolatile memory elements, and integrated circuit memory systems have been developed which utilize on-chip generation of the high programming and erasing voltages, such as described in U.S. Pat. No. 4,263,664 and U.S. Pat. No. 4,326,134 entitled "Integrated Rise-Time Regulated Voltage Generator Systems", which are incorporated herein by reference.

It would be useful in the design of circuits such as EEPROM memories which operate with a relatively low voltage (e.g., 5 volt) external power supply but generate relatively high internal voltages for on-chip functions such as programming and erasing of nonvolatile memory cells to have high voltage clamping circuits with low power consumption and readily controllable clamping characteristics. Because on-chip high voltage generators have quite limited current output capability (e.g., typically about 10 microamperes), it is desirable that a clamp circuit not draw current except when it is desired that clamping occur. Even when clamping does occur, it is desirable that the current may be controlled or limited in such a way that the high voltage output of the generator can be maintained at a relatively constant predetermined level, such as a desired potential in the range of 10 to 45 volts for an extended period of time such as from 1 to 25 milliseconds without collapsing the voltage generator output. In integrated circuits utilizing on-chip substrate bias generators, it is also desirable to provide integrated clamping circuits and methods which do not transmit substantial current to the semiconductive substrate as an additional load to the substrate bias generator. In addition, as a result of charge trapping effects, high voltage generator control devices such as gated high voltage reference diodes tend to deteriorate as a function of total high voltage current transmitted through the devices. It would be desirable to provide clamping circuitry that will prevent excess current from flowing through such reference elements, to prolong their ability to provide a stable reference voltage.

Accordingly, it is an object of the present invention to provide improved integrated circuit methods and apparatus for clamping high voltage generator power supplies. It is a further object to provide improved integrated circuit high voltage power supply systems utilizing clamp-protected reference voltage elements. These and other objects of the invention will become apparent from the following detailed description and the accompanying drawings, of which:

FIG. 1 is a schematic circuit diagram of an embodiment of integrated circuit high voltage clamp circuitry in accordance with the present invention;

FIG. 1a is a top view of an integrated circuit layout for clamp circuit embodiment of FIG. 1;

FIG. 2 is a schematic circuit diagram of a further embodiment of clamp circuitry in accordance with the present invention;

FIG. 2a is a top view of an integrated circuit layout for clamp circuit embodiment of FIG. 2;

Figure 4:
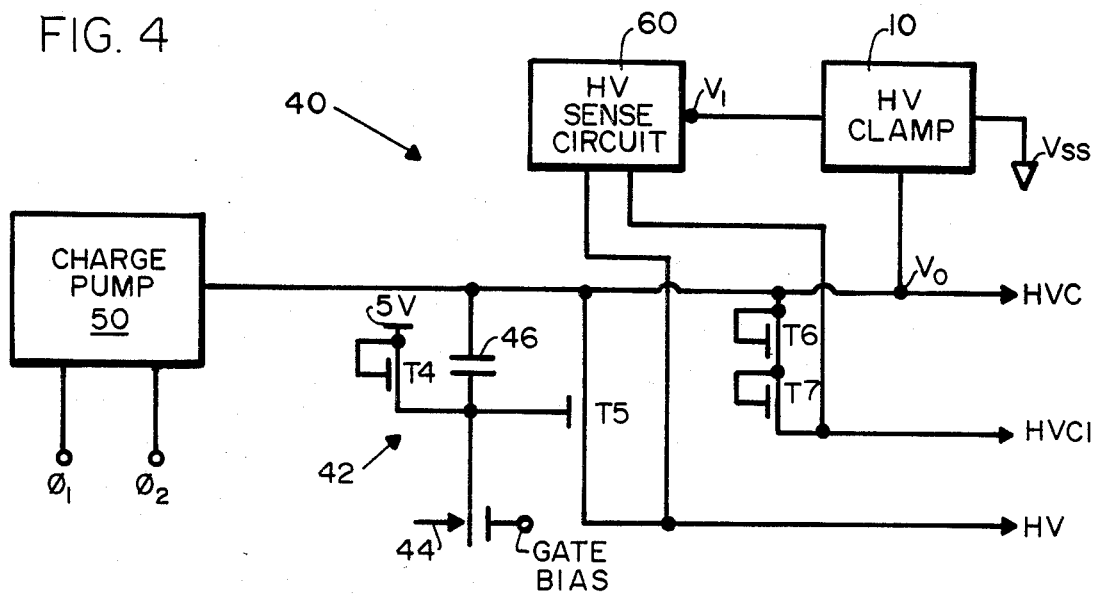
FIG. 4 is a block diagram of an on-chip high voltage power supply suitable for use with the clamp circuitry of FIG. 1 and FIG. 2.

Generally in accordance with the present invention, methods and integrated circuit devices are provided for clamping a high voltage current source such as an integrated circuit high voltage generator so that the high voltage source does not exceed a predetermined potential. Also provided are clamped integrated circuit high voltage power supply systems which utilize such methods and apparatus.

In accordance with various device aspects of the present invention, integrated high voltage clamp circuitry is provided in which the conductivity of a current regulating transistor is adjusted by means of controlled capacitive coupling with the high voltage source which is to be regulated.

Such integrated clamp circuitry may comprise high potential input means for making electrical connection with a high voltage power supply desired to be clamped, grounding means for making electrical connection with a reference potential current sink, and clamping current control means responsive to a clamping control potential for regulating the flow of current between the high potential input means and the grounding means to control the potential of the high potential input means. The clamping current control means may desirably comprise one or more MOS (metal oxide semiconductor) transistors, the conductivity of which is regulated by a control potential applied to the gate thereof from a control potential node. The power supply to be clamped will desirably be an integrated circuit high voltage generator means for generating a high voltage in the range of from about 10 to about 50 volts, at a limited current output capability in the range of from about 0.1 to about 100 microamperes, and more typically in the range of from about 1.0 to about 15 microamperes. The clamping current control transistor means should best have a controllable conductivity range which ranges from substantially completely preventing current flow to the grounding reference sink (i.e., less than 5 percent and preferably less than 1 percent of the current output capability of the generator), to a conductivity which is adequate to conduct the limited current output of the high voltage generator means to the grounding reference sink.

The integrated circuitry may further comprise means for generating said clamping control potential, for regulating the clamping current control means, comprising capacitive coupling means for capacitively coupling said control potential node to the high potential input means, and means for controlling the coupling of said control potential node to a reference potential source such as said grounding means. Desirably, the capacitive coupling means will be an integrated circuit capacitor having a capacitance in the range of from about 0.005 to about 2 picofarads, and more preferably in the range of from about 0.1 to about 1 picofarad, one plate of which makes electrical connection to the high potential input means, and the other plate of which makes electrical connection to the gate of the MOS clamp current regulating transistor. The means for controlling the coupling of said control potential node to a reference potential source such as ground may desirably comprise one or more MOS transistors by means of which the reference potential of said reference potential source is applied to said controlling potential node, and thereby to said clamp current regulating transistor, when such means is in a conducting or "on" state, and to electrically isolate said node, and thereby isolate said regulating transistor gate and the capacitor plate connected thereto from said reference potential when said means is in a nonconducting or "off" state. By electrically isolating the transistor gate and capacitor plate after application of a high voltage to the high voltage circuit input, the potential difference that has been created across said capacitor is used to set the action of the clamp. That is, the clamping circuit functions at this point to couple only as much current across said clamping current control transistor so as to maintain said high voltage power supply clamped at the desired potential.

The methods and integrated circuit systems herein for high voltage clamping are particularly useful in combination with integrated circuit high voltage generators, which upon activation generate a rising relatively high potential, having a peak potential in the range of from about 10 volts to about 50 volts, but which have only a limited current output capability in the range of from about 0.1 to about 100 microamperes.

In accordance with the present invention, high voltage power supply systems utilizing integrated clamp circuitry may comprise generator means for providing a high voltage signal having a maximum potential of at least 10 volts and preferably in the range of from about 10 to about 50 volts, means for sensing when the output of the high voltage generator has reached a desired, predetermined potential, and means for providing a control signal to the clamp circuitry and to set the potential at which the clamp will conduct current to the reference potential sink to prevent the high voltage output from rising above said predetermined potential.

In accordance with additional aspects of the present invention, methods are provided for clamping a high voltage signal source in an integrated circuit so that it does not rise above a predetermined level, comprising the steps of capacitively coupling the high voltage signal source potential across a capacitor to a clamp current control node, and establishing a potential difference between the high voltage source signal and the control node, such that the potential of the control node varies as a function of the signal source potential minus the potential difference across said capacitor. The method further comprises regulating the conduction of current between the high voltage signal source and a current sink as a predetermined function of the potential at said control node, such that the potential of the high voltage source signal does not exceed a predetermined value. Desirably, the ground potential current sink may serve as the reference potential, such that when the potential of the control node exceeds the ground sink potential by an amount which desirably does not exceed about one volt, sufficient clamping current is conducted from the high voltage signal source to the ground potential sink to prevent further substantial rise in the potential of the high voltage source signal. The potential difference between the capacitively coupled current node and the high voltage signal source may be provided by maintaining electrical connection of the capacitively coupled control node to a reference potential, and subsequently disconnecting the control node from electrical connection with the reference potential such that the node is rendered in an electrically floating condition responsive to its capacitive coupling to the high voltage signal source. By thus regulating the conduction of current from the high voltage source to a current sink in response to the floating electrical potential of the control node when the potential of the control node exceeds a predetermined value above the reference potential, the high voltage signal may be clamped so that it does not exceed a preselected value which depends on the potential difference established between the high voltage signal and the control node.

Further in accordance with preferred aspects of the method, the integrated, clamped high voltage generating methods may further include the steps of initiating the generation of a high voltage signal, to provide an output signal of increasing potential, detecting when the potential of the high voltage signal exceeds a predetermined threshold value, and generating a control signal for electrically isolating said control node in response thereto.

Having generally described various method and device aspects of the present invention, particular features of the invention will now be more particularly described with respect to the specific embodiments illustrated in FIGS. 1-6 of the drawings.

Illustrated in FIG. 1 is an embodiment 10 of an integrated circuit high voltage clamp which is adapted to clamp the potential of a high voltage input node Vo at a potential determined by the circuit 10, for a substantial period of time, corresponding to the on time of said high voltage source potential. This may be on the order of at least about one microsecond, and preferably in the range of from about 100 microseconds to about 25 milliseconds or more, as will be more fully discussed herebelow. FIG. 4 shows the clamp circuit 10 as part of a clamped power supply system 40. As illustrated in FIG. 4, one node of the clamp circuit 10 may be connected to the output line HVC of a high voltage generator, which when activated provides a rising output potential Vo. Vo is the potential that must be clamped to prevent it from rising above a predetermined value. For applications such as programming nonvolatile memory cells it is desirable to clamp the high voltage generator output so that it does not exceed an optimum potential cell operation, which potential will depend on the type of memory cells and, to some degree, on the amount of use of the cells, but which typically may be in the range of from about 15 to about 35 volts. The clamping is carried out by regulating the conduction of clamping current from node Vo to ground potential (node Vss). Referring again to FIG. 1, it is seen that this regulation is by means of an MOS field effect transistor T1. The potential of the gate of transistor T1, the potential at control potential node V2, is controlled by a capacitor C and another MOS field effect transistor T2. Node V2 is capacitively coupled to high voltage node Vo by means of capacitor C, and coupled to said ground potential node Vss as a function of the state of logic level control signal V1 which is applied to the gate of regulation transistor T2. The current sink will desirably be a grounding line directly connected to a ground pin of the integrated circuit. Sinking the current to the substrate is especially avoided so as to prevent excess loading of a substrate bias pump or generator.

Illustrated in FIG. 1a is a top view, broken away from other components of the integrated circuit chip, of an integrated circuit layout for the high voltage clamp circuit 10 shown schematically in FIG. 1. In FIG. 1a, various layers of the device are shown transparently in overlying relationship. The device components, like other integrated circuit components of the clamped power supply system 40, shown in FIG. 4, and the overall integrated circuit system which utilizes the clamped power supply output, may be fabricated on a p-type monocrystalline silicon substrate 12 in accordance with known n-channel MOS fabrication techniques, and is adapted to utilize a 5 volt external power supply.

In the illustrated device 10, N+ regions in the p-type substrate 12 form source/drain regions 14, 16, and define transistor T1. Transistor T1 is an enhancement type high voltage regulating transistor. Similarly, an N+ region forms a drain 18 in the p-type substrate 12, which, together with N+ source region 16 and the intervening portion of the p-type substrate, forms transistor T2. Transistor T2 is also an MOS enhancement type transistor.

An N+ implant region 19 forms one plate of the capacitor C. Both the N+ region 14 and the capacitor plate N+ zone 19 make electrical connection through the overlying dielectric oxide layer with overlying metal (e.g., aluminum) line 22 forming high voltage node Vo. Node Vo in turn, connects with the high voltage power supply signal HVC which is to be clamped by the circuit 10. The other plate of the capacitor C is formed by a dielectrically isolated polysilicon electrode 24 overlying the n-type zone 19.

An extension of the polysilicon electrode 24, node V2, overlies the channel region between drain and source 14, 16 to form the gate of transistor T1. The polysilicon electrode 24 of capacitor C makes electrical connection through the intermediate dielectric oxide with suitable metal (e.g., aluminum) electrode 26, which in turn connects to N-type zone 18 forming the drain of transistor T2. The gate of transistor T2 may be formed by a dielectrically isolated polysilicon line 28 to which is applied the clamp control potential V1, as shown in FIG. 1a. N-type zone 16, which forms the source regions of both transistors T1 and T2, makes appropriate electrical connection to metallic or polysilicon ground potential terminal electrode 30 through the overlying oxide dielectric, as shown in FIG. 1a.

A second embodiment of a clamping circuit according to the present invention is illustrated in FIG. 2. Circuit 20 is similar to embodiment 10 of FIG. 1, except that it is provided with an additional regulation transistor T3 to improve the clamp circuit's response.

Illustrated in FIG. 2a is a top view of an integrated circuit layout for the enhanced clamp circuit implementation of FIG. 2, which is similar to the layout of device 10 shown in FIG. 1a, but including an additional threshold-lowering reference transistor T3. Transistor T3 is formed as an enhancement type transistor between N-type regions 17, 18 gated by electrode 26a.

In the illustrated embodiments 10, 20, the transistors are n-channel MOS type enhancement transistors having a threshold potential Vt of about 1 volt (e.g., 0.8 volts). Typical sizes of the illustrated transistors are represented by Z/L dimensions (width to length) of 10 microns by 6 microns for transistor T1 and 5 microns by 6 microns for transistors T2 and T3. The capacitance of capacitor C may vary widely, typically from 0.01 picofarads to 1 picofarad, depending on the capacitive coupling desired.

Clamp circuit 10 is set when a control potential V1, applied to transistor T2, which has been held to a high value (e.g., 5 volts) is dropped to a low value (e.g., 0 volts). This is defined to occur when the potential of Vo has risen to a predetermined value measured by an appropriate reference and control circuit. When the potential V1 drops, node V2, which is connected to the gate of transistor T1, is rendered in a substantially isolated electrical condition, at a fixed potential difference from the high voltage Vo due to the operation of capacitor C. A change in the potential Vo will be reflected at the gate of transistor T1 by capacitive coupling. When the gate potential V2 rises a few tenths of a volt above the threshold of clamping transistor T1, it conducts enough current to stop the high voltage generator from raising Vo any further. As previously indicated, embodiment 20 of FIG. 2 is similar to embodiment 10 of FIG. 1, but further includes a transistor T3 to provide an approximate one Vt reference to the threshold voltage of transistor T1. To provide improved response characteristics, the potential Vo of embodiment 20 of FIG. 2 is permitted to rise approximately one Vt less than the potential Vo of embodiment 10 of FIG. 1.

In accordance with the present invention, the clamping level may be varied depending on other performance parameters of the circuit and/or other timing parameters. For example, the clamp may be adjusted to set at a predetermined potential which itself may be varied. In this regard for example, the clamp may be adjusted to set at a predetermined voltage which progressively increases with long term use of the integrated circuit device of which it is a part, say from 25 to 30 volts to 35 volts, depending on circuit performance parameters, as a circuit "ages" in order to maintain overall performance parameters of an integrated circuit for more extended periods of time. It is also noted that the clamping current is directed to a ground potential node of the integrated circuit, rather than to the substrate. Accordingly, the clamp circuits 10, 20 avoid imposing an additional load on any substrate bias generators which may be utilized in the integrated circuit utilizing the clamping circuit.

Having generally described the devices 10, 20 of FIGS. 1 and 2 their operation will now be described in more detail with respect to the high voltage generator system 40 illustrated in FIGS. 4–6, which incorporate a clamp circuit 10 or 20 as shown in FIGS. 1 and 2.

In the high voltage generator system 40, a charge pump 50 (shown in detail in FIG. 5) provides a high voltage, low current output signal HVC which is intended to be used, for example, in writing and erasing nonvolatile memory elements of a memory array, and which is desirably clamped at a controlled maximum potential. A gated diode reference circuit 42 comprising capacitor 46, MOS transistors T4, T5, and gated diode 44 provides a high voltage reference potential, for initiating operation of clamp circuit 10 or 20, upon diode breakdown at a predetermined potential. The diode breakdown of device 44 produces, by means of transistors T6 and T7, a potential difference between output node HV and output node HVC1, which difference is sensed by HV sense circuit 60 HV sense circuit 60 is illustrated in detail in FIG. 6.

Upon sensing a difference in potential between node HV and node HVC1, as the potential of HVC rises due to the rising potential provided by charge pump 50 upon activation thereof, the sense circuit 60 provides a logic level output signal V1 to the clamp circuit 10 or 20. Signal V1, via clamp circuit 10, 20 prevents high voltage output node HVC of the charge pump 40 from rising above a potential determined at the time of setting the clamp by control signal V1, as previously described.

Figure 5:
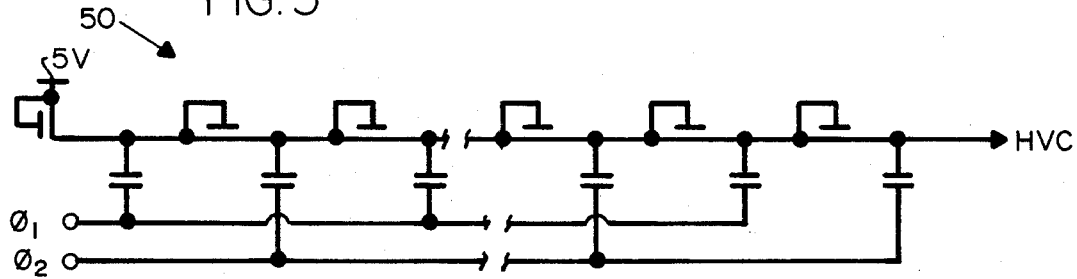
FIG. 5 is a circuit diagram of the high voltage charge pump of the power supply of FIG. 4.

As shown in FIG. 5, charge pump 50 may be driven by non-overlapping two phase clock signals 01 and 02, which may be provided by any suitable two phase clock generator, such as described in U.S. Pat. No. 4,263,664 and in the above referred to U.S. Pat. No. 4,326,134. The clock signals may be provided with varying amplitude between 0 and 5 volts peak-to-peak, at a frequency of several megahertz. The transistors in charge pump 50 are enhancement type transistors. Operation of a charge pump circuit 50 containing, for example 20 stages may provide an output potential up to about 50 volts, typically (depending upon the size of the charge pump) at a peak current capability in the range of from 1 microampere to about 10 microamperes. Upon starting this generator, it will produce a steadily rising output potential at output node HVC. The rate of this rise is determined by the output load, which in an EEPROM device is largely a capacitive load. The output at HVC will desirably rise at a nominal rate of 20–40 volts per millisecond, in the illustrated embodiment, but other ramp rates may be desirable for different applications. However, it will be appreciated that such integrated circuit charge pump may readily be made larger or smaller in size. It will further be appreciated that relatively high voltages (e.g., from 25 to 50 volts) can be readily generated from relatively low voltage clock signals (e.g., 5 volts or less). In the illustrated embodiment 40 of FIG. 4, the maximum ouput voltage is set by the gated diode reference device 44, which provides a reference voltage independent of chip power supply voltage levels. Other means for providing a control signal to set the clamp circuit 10, 20 may also be provided, for example, based on reference potential and/or timing-controlled circuitry, depending on the particular circuit application.

Figure 6:
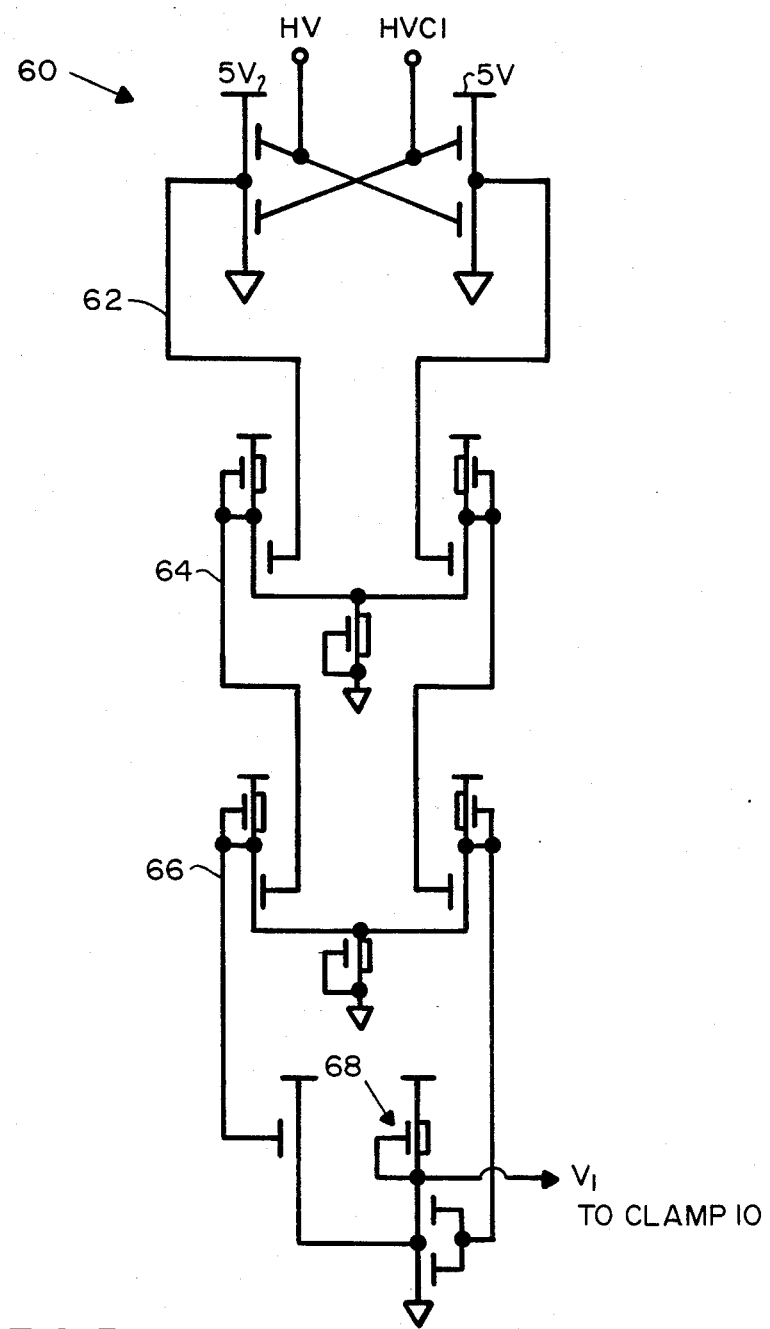
FIG. 6 is a circuit diagram of a high voltage sense circuit of the power supply of FIG. 4.

In the example illustrated in FIG. 6, HV sense circuit 60 senses when the high voltage potential HV has reached a maximum desired level. This circuit controls, or sets, the operation of the clamp circuit 10, 20. The circuit 60 detects when the control signal HVC1 reaches a potential a few volts above the potential of HV. The circuit 60 comprises a translator stage 62 which translates the high voltage input potential of HV and HVC1 to respective voltages of about 2½ volts, with a signal difference of about plus or minus 0.1 volt. These voltages, in turn, are applied to a depletion differential amplifier stage 64. The stage 64 amplifies the small signal differential of stage 62 to provide a ±0.3 volt differential signal to a further amplification stage 66 which provides an amplified differential signal of about ±1.5 volts. The amplifier stage 66 feeds a Schmitt trigger-like circuit 68 which provides a well defined "high" or "low" logic level signal V1 for the clamp circuit 10 or 20. The output logic signal V1 goes low when the potential of HVC1 is a few volts above HV.

As indicated, an integrated circuit gated diode device 44 is provided in the reference circuit 42 which specifies the high voltage which controls the logic of output node V1, the control node for clamp 10 or 20. In a device such as a nonvolatile electrically erasable read only memory, the gated diode in the reference circuit will be exercised repeatedly as the nonvolatile memory is charged in the operation of the device. Unfortunately, a gated diode will begin to "trap up", i.e. retains excessive charge, and its gated diode voltage may accordingly slowly increase as a function of total current sunk by the gated diode. In conventional circuits, such trapping significantly limits the number of cycles that this system could provide a relatively stable response. Accordingly, to maximize the number of available cycles (potentially millions of cycles), it is desirable to protect the gated diode 44, by minimizing the current conducted through the gated diode per high voltage detection event. In the illustrated circuit 40, when the gated diode breaks down to detect a predetermined potential for the reference circuit, it is substantially immediately shut off by operation of the clamp circuit 10 or 20, in order to prolong its maintenance of a relatively fixed reference level. That is, once gated diode 44 breaks down, any excess current from charge pump 50 is shunted through clamp circuit 10, 20.

The clamping voltage should, therefore, be chosen to not be substantially above the gated diode reference voltage because substantial capacative charging voltage from the capacitor 46 to the gated diode 44 is imposed on the gated diode every time a high voltage cycle occurs. In accordance with the present invention, the difference in voltage between the clamp potential and the reference circuit potential is restricted once the gated diode in the reference begins to conduct. This is accomplished by the responsive "soft" clamping action of the circuits 10, 20 of FIGS. 1 and 2, which limit the rise of the HVC signal line by controllably grounding it through the node Vo of the high voltage clamp circuit.

Figure 3A:
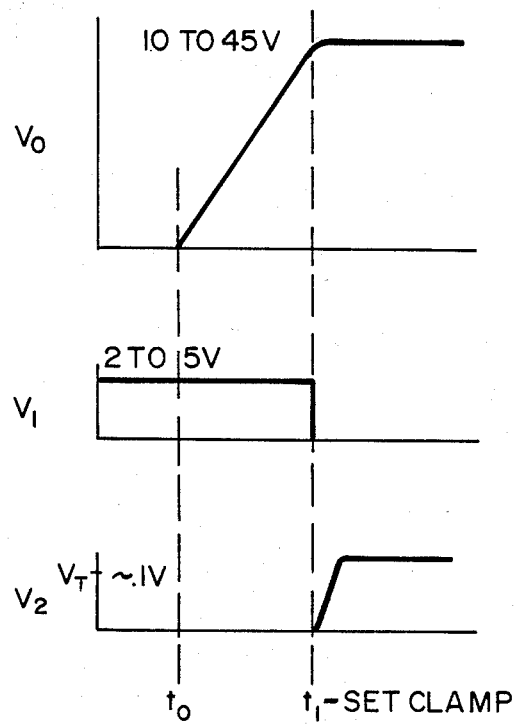
FIGS. 3a and 3b are diagrams illustrating the operation of the clamp circuits of FIGS. 1 and 2, respectively.

This operation of clamp circuits 10 and 20 will now be described in detail with regard to the timing diagrams of FIG. 3. As shown in FIG. 3a for device 10 of FIG. 1, the high voltage generator may be activated at a time $t_o$ to provide a rising potential signal at node Vo. When high voltage is provided to node Vo from high voltage generator 40, capacitor C connects the node Vo to the gate of transistor T1. Transistor T2 is initially "on" due to the existance of signal $V_1$ coupled to its gate. Thus, node V2 is initially coupled to ground. As the potential of node Vo is raised, however, the drain voltage of transistor T1 goes up. At this point, transistor T1 is in a nonconductive condition because it will not conduct until its gate, node V2, is at or above its threshold potential Vt. Accordingly, when transistor T2 goes "off" at time $t_1$, the capacitor C translates the increasing increment of voltage of node Vo onto the gate of transistor T1. When the gate of transistor T1 is raised to a level near threshold or slightly higher, about 1 volt, then transistor T1 becomes conductive, so that the current generated by charge pump 50 is transmitted through transistor T1 to ground.

The function of transistor T2 is to control the Vo clamping level of voltage by controlling when the transistor T1 will being to conduct current from node Vo to the ground node. Note that as the potential of node Vo is raised toward a predetermined potential, say 30 volts, and with transistor T2 maintained in a conducting state by the action of logic control signal V1, capacitor C is correspondingly charged up towards this 30 volt potential of node Vo. This is because the bottom plate of capacitor C is held to ground potential because of transistor T2. At time T1 when transistor T2 turns off through the removal of control potential V1 (triggered by the gated diode reference breakdown at its predetermined reference potential), the conductive connection of the lower capacitor plate to ground node Vss is removed. As a result, the gate of transistor T1 is no longer maintained at ground potential, but rather will be at an isolated, floating potential determined by capacitor C's charge and the capacitive connection to node Vo. If the potential of node Vo rises about a volt (one volt), e.g., from 30 to 31 volts, the lower plate of capacitor C will rise about 1 volt, thereby raising the potential of the gate of transistor T1 by its threshold potential with respect to ground potential Vss. This renders transistor T1 conductive. In this manner, clamping of Vo is provided, for example, at a 31 volt level. In effect, the circuit sets the clamp potential of Vo to the potential of Vo at the time of the clamp circuit 10, 20 sets plus the threshold potential of the transistor T1.

It should be noted that the operation of the clamp circuit 10 does not cause the potential at node Vo to drop below the potential of the node at the time the clamp is set. For example, if node Vo is clamped at a 31 volt potential as in the previous discussion, and if the potential later drops, e.g., from 31 to 30.9 volts, then the potential of the gate of transistor T2 would go to 0.9 volts and the transistor becomes less conductive and less current is conducted to ground, accordingly relaxing the current draw from the supply so it does not collapse the supply. As is seen, therefore, the clamp is maintained at a predetermined voltage by a diode-like response caused by the voltage feedback mechanism.

The voltage set by clamp circuit 10, 20 will be susbstantially constant with time over small time periods (e.g., over several milliseconds), because the leakage currents affecting potential $V_2$ are small. In addition, the capacitor C may be of sufficiently large capacitance that the capacitance ratio to the amount of thermal junction leakage is relatively large with respect to thermal leakage, thereby prolonging the effectively flat response of the clamp 10.

Figure 3B:
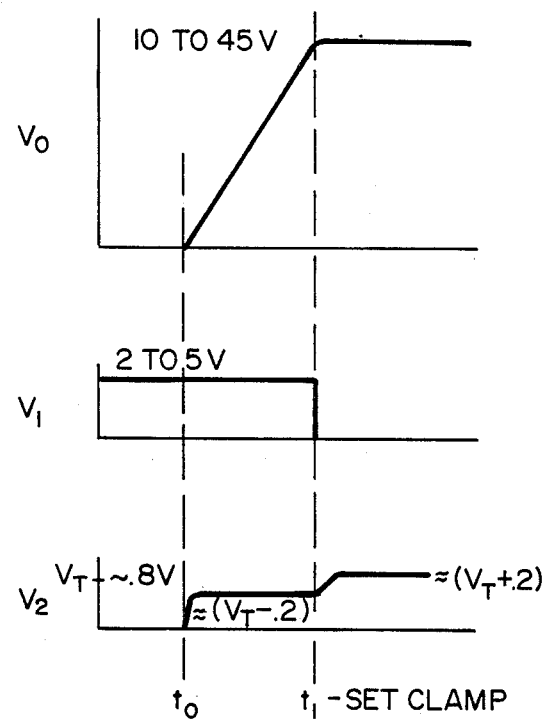

In the embodiment 20 of FIG. 2, modifications are made to set the clamp more precisely, thereby further reducing the differential between the gated diode breakdown voltage and the clamp voltage. In the operation of embodiment 20 as shown in FIG. 3b, another transistor T3 is inserted in series with T2 between the gate of transistor T1 and the ground potential node. If control signal V1 is high, transistor T2 is "on" and the source of transistor T3 is essentially tied to ground potential. When the potential at node Vo starts to rise at time $t_o$, capacitor C charges up node V2 until transistor T3 becomes very slightly conductive, at its pre-threshold range (i.e., some tenths of a volt below the threshold).

Because transistors T3 and T1 are the same type of transistor (n-channel enhancement transistors), this places transistor T1 in a very slightly conductive range (e.g., on the order of nanoamperes), which does not substantially load the high voltage generator, but does place the gate voltage of T1 very close to the threshold value.

When transistor T2 goes off, under control of the output signal V1 triggered indirectly by the breakdown of gated diode 44, the gate voltage of transistor T1 of the clamp 20 rises only slightly (a few tenths of a volt) and sets the clamp within a few tenths of a volt of the value of Vo at the time the clamp is set by signal V1. In embodiment 20 of FIG. 2, the potential of node Vo may rise in the range of 0.3 to 0.4 volt before clamp 20 sets, as compared to a rise of 0.8 to 1 volt for the embodiment 10 of FIG. 1. Accordingly, it will be appreciated that if it is desired to clamp the high voltage output at a predetermined potential, the reference voltage provided by the gated diode or other reference voltage means may be selected to be only 0.3–0.4 volt less than the desired clamp voltage for the embodiment 20, but would be selected to be 0.8 to 1 volt lower for the embodiment 10. Accordingly, transistor T3 provides a threshold reference for transistor T1 which effectively permits the clamp 20 to more precisely limit the voltage rise after the clamp is set.

It will be appreciated that in accordance with the present invention, integrated circuit high voltage clamp systems have been provided which have particular utility in the provision of high voltage on-chip power supplies such as employed in 5 volt only n-channel MOS EEPROM circuits. However, while various aspects of the present invention have been described with particular reference to a specific n-channel MOS technology embodiment and utilization, it will be appreciated that various further uses, modifications and adaptations will become apparent based on the present disclosure, and are intended to be within the spirit and scope of the present invention.

In this regard, it will be appreciated, for example, that devices and methods in accordance with the invention may be provided with various integrated circuit technologies in addition to n-channel MOS technology, such as p-channel MOS (including CMOS/SOS) and it will be appreciated that the potential values may be regarded as the absolute value of the difference from a reference potential which will typically be ground potential. It will also be appreciated that clamp circuitry may be provided which produces a decreasing high voltage clamp effect by controllably reducing the difference between the high voltage node and the control node, after it has been established.

Various of the features of the present invention are set forth in the following claims.

What is claimed is:

1. An integrated circuit for clamping a high voltage source having a limited current output, so that said source does not exceed a predetermined potential, comprising: high potential input means for making electrical connection with a high voltage power source desired to be clamped; grounding means for making electrical connection with a reference potential current sink; a control potential node; means responsive to the potential of said high potential input means exceeding a predetermined potential for developing a clamping control potential at said control potential node as a function of the difference between the potential of said high potential input means and said predetermined potential; and clamping current control means responsive to said clamping control potential at said control potential node for regulating the flow of current between the high potential input means and the grounding means such that said current is conducted only when the potential of said high potential input means exceeds a predetermined value.

2. Integrated clamp circuitry in accordance with claim 1 wherein the clamping current control means comprises at least one MOS transistor including a gate, a source and/or drain, said gate connected to said control potential node, the conductivity of said transistor being regulated by said clamping control potential.

3. Integrated clamp circuitry in accordance with claim 2 wherein said MOS transistor has a controllable range of conductivity, from a conductance which substantially completely prevents current flow to said grounding means to a conductivity which is adequate to conduct the limited current output of the high voltage source to said grounding means.

4. Integrated clamp circuitry in accordance with claim 1 wherein said high voltage source includes an integrated circuit generator means, integrated with the integrated clamp circuitry and in electrical connection with said input means, for generating a high voltage in the range of from about 10 to about 50 volts at a limited current output capability in the range of from about 0.1 to 100 microamperes.

5. An integrated circuit for clamping a high voltage source having a limited current output, so that said source does not exceed a predetermined potential, comprising: high potential input means for making electrical connection with a high voltage power source desired to be clamped; grounding means for making electrical connection with a reference potential current sink; a control potential node; a clamping current control means responsive to a clamping control potential at said control potential node for regulating the flow of current between the high potential input means and a grounding means such that said current is conducted only when the potential of said high potential input means exceeds a predetermined value, said clamping current control means including at least one MOS transistor having a gate, a source and/or a drain, said gate being connected to said control potential node, the conductivity of said transistor being regulated by said clamping control potential; and means for providing said clamping control potential to the control potential node including capacitive coupling means for capacitively coupling said control potential node to the high potential input means, and means for controlling the flow of current between the control potential node and a reference potential source.

6. Integrated clamp circuitry in accordance with claim 5 wherein the capacitive coupling means comprises an integrated circuit capacitor having a capacitance in the range of from about 0.05 to about 2 picofarads, one plate of which makes electrical connection to the high potential input means, and the other plate of which makes electrical connection to said control potential node.

7. Integrated clamp circuitry in accordance with claim 6 wherein said means for controlling the current flow between the control potential node and a reference potential source comprises at least one MOS transistor by means of which a reference potential may be applied to said control potential node and which is adapted to electrically isolate said control potential node when in a conducting state to electrically isolate the gate of said clamping current control means transistor and capacitor plate.

8. An integrated circuit clamped high voltage power supply comprising
generator means for providing a high voltage signal having a maximum potential of at least 10 volts,
clamp means for conducting the generator output current to a reference potential sink only at potentials exceeding a potential established as a function of a potential difference across an integrated circuit capacitor,
means for sensing when the output of the high voltage generator has reached a desired, predetermined potential, and
means for providing a control signal to said clamp means for establishing said potential difference in response to said sensing means.

9. The power supply of claim 8, wherein said means for providing a control signal to said clamp means comprises at least one transistor operatively connected between said reference potential sink and said clamp means, said transistor operating in response to said sensing means to electrically isolate said clamping means from said reference potential sink.

10. A method for clamping a high voltage integrated circuit signal source so that it does not rise above a selected potential level, comprising the steps of: capacitively coupling the high voltage signal source potential to a clamp current control node; establishing a potential difference between the high voltage source signal and the control node; enabling the potential of the control node to vary as a function of the signal source potential minus said potential difference when said selected potential level is substantially reached; and, regulating thereafter the conduction of current between the high voltage signal source and a current sink as a predetermined function of the potential of said control node such that the potential of the high voltage source signal does not exceed said selected potential level.

11. A method in accordance with claim 10 wherein the current sink is a ground potential node, and wherein said potential difference is created by initially coupling said control node to said ground potential node, such that when the potential of the control node exceeds said ground node potential by an amount which does not exceed about one volt, sufficient clamping current is conducted from the high voltage signal source to the ground potential node to prevent further substantial rise in the potential of the high voltage signal source.

12. A method in accordance with claim 10 wherein the potential difference between said capacitively coupled current node and the high voltage signal source is provided by maintaining electrical connection of the capacitively coupled control node to a reference potential, and subsequently disconnecting the control node from electrical connection with the reference potential such that the node is rendered in an electrically floating condition responsive to its capacitive coupling to the high voltage signal source.

13. A method in accordance with claim 10 for generating a clamped, high voltage output pulse, further comprising the steps of initiating the generation of a high voltage signal to provide an output signal of increasing potential, detecting when the potential of the high voltage signal exceeds a predetermined threshold value, and generating a control signal for electrically isolating the control node in response thereto.

14. An apparatus for clamping a charge pump high voltage source so that it does not rise above a selected potential with respect to a reference potential sink, comprising: means for sensing when said high voltage source has reached a predetermined level with respect to said selected clamping potential and for outputting a control signal in response thereto; control means including a control node normally operatively connected to said reference potential sink, a capacitor connected between said control node and said high voltage source, and means responsive to said control signal for decoupling said control node from said reference potential sink; and, means for coupling a controlled amount of current from said high voltage source to said reference potential current sink in response to the potential of said control node rising a predetermined amount above the reference potential of said reference potential sink.

15. The apparatus of claim 14 wherein said reference potential sink comprises the ground node of said high voltage source.

16. The apparatus of claim 14 wherein said means for coupling a controlled amount of current from said high voltage source to said reference potential current sink comprises a transistor whose gate is coupled to said control node.

17. The apparatus of claim 14, wherein said means responsive to said control signal for decoupling said control node comprises at least one transistor coupled between said control node and said reference potential sink and wherein said control signal is coupled to the gate thereof.

* * * * *